(12) United States Patent
Wu et al.

(10) Patent No.: US 12,165,906 B2
(45) Date of Patent: Dec. 10, 2024

(54) APPARATUS AND METHODS FOR HANDLING SEMICONDUCTOR PART CARRIERS

(71) Applicant: Taiwan Semiconductor Manufacturing Co., Ltd., Hsin-Chu (TW)

(72) Inventors: Ren-Hau Wu, Hsin-Chu (TW); Yan-Han Chen, Hsin-Chu (TW); Cheng-Kang Hu, Kaohsiung (TW); Feng-Kuang Wu, Hsin-Chu (TW); Hsu-Shui Liu, Pingjhen (TW); Jiun-Rong Pai, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 781 days.

(21) Appl. No.: 16/598,136

(22) Filed: Oct. 10, 2019

(65) Prior Publication Data

US 2020/0161161 A1 May 21, 2020

Related U.S. Application Data

(60) Provisional application No. 62/752,835, filed on Oct. 30, 2018.

(51) Int. Cl.
| | | |
|---|---|---|
| *H01L 21/687* | (2006.01) | |
| *B25J 9/16* | (2006.01) | |
| *B65G 47/90* | (2006.01) | |
| *H01L 21/67* | (2006.01) | |
| *H01L 21/677* | (2006.01) | |
| *H04N 23/56* | (2023.01) | |

(52) U.S. Cl.
CPC ...... *H01L 21/68707* (2013.01); *B25J 9/1697* (2013.01); *B65G 47/905* (2013.01); *H01L 21/67259* (2013.01); *H04N 23/56* (2023.01)

(58) Field of Classification Search
CPC .......... H01L 21/68707; H01L 21/67766; B25J 9/1697; B65G 47/905; H04N 5/2256
See application file for complete search history.

(56) References Cited

U.S. PATENT DOCUMENTS

| | | | | |
|---|---|---|---|---|
| 7,670,555 | B2 * | 3/2010 | Hoover | ................... B25J 15/026 |
| | | | | 422/510 |
| 9,333,649 | B1 * | 5/2016 | Bradski | .................... B25J 19/00 |
| 9,919,430 | B1 * | 3/2018 | Bosboom | ............. B25J 15/0014 |
| 10,899,015 | B2 * | 1/2021 | Barth | ..................... B25J 9/1697 |
| 2009/0060690 | A1 * | 3/2009 | Sagun | ............... H01L 21/67742 |
| | | | | 414/222.01 |

(Continued)

FOREIGN PATENT DOCUMENTS

| | | | | |
|---|---|---|---|---|
| CN | 104979245 A | | 10/2015 | |
| CN | 107324041 A | * | 11/2017 | ............. B25J 13/08 |

(Continued)

*Primary Examiner* — Gerald McClain
(74) *Attorney, Agent, or Firm* — Duane Morris LLP

(57) ABSTRACT

An apparatus for handling semiconductor part carriers includes: a mechanical arm and an imaging system coupled to the mechanical arm, wherein the mechanical arm is configured for holding a semiconductor part carrier, and the imaging system is configured for automatically locating a goal position on a surface onto which the semiconductor part carrier is to be placed.

20 Claims, 13 Drawing Sheets

(56) References Cited

U.S. PATENT DOCUMENTS

| | | | | |
|---|---|---|---|---|
| 2015/0314960 A1* | 11/2015 | Yap | ............... | B65G 1/137 |
| | | | | 414/807 |
| 2019/0034727 A1* | 1/2019 | Chihara | ............... | G06T 7/73 |
| 2019/0152721 A1* | 5/2019 | Xu | ............... | H01L 21/6773 |
| 2021/0335651 A1* | 10/2021 | Choi | ............... | B25J 9/1697 |
| 2023/0035556 A1* | 2/2023 | Chang | ............... | H01L 21/67259 |

FOREIGN PATENT DOCUMENTS

| | | |
|---|---|---|
| CN | 107851594 A | 3/2018 |
| JP | S6269633 A | 3/1987 |
| JP | H0536815 A | 2/1993 |
| TW | M510835 | 10/2015 |

* cited by examiner

APPARATUS AND METHODS FOR HANDLING SEMICONDUCTOR PART CARRIERS

CROSS-REFERENCE TO RELATED APPLICATION

The present application claims priority to U.S. Provisional Patent Application No. 62/752,835, filed on Oct. 30, 2018, which is incorporated by reference herein in its entirety.

BACKGROUND

During manufacturing of a semiconductor device, the device is usually processed at many work stations or processing machines. The transporting or conveying of a partially finished device, or a work-in-process (WIP) part, is an important aspect in the total manufacturing process. The conveying of WIP parts, e.g. semiconductor wafers, is especially important in the manufacturing of integrated circuit (IC) chips due to the delicate nature of the chips. Furthermore, in fabricating an IC product, a multiplicity of fabrication steps, i.e. as many as several hundred, is usually required to complete the fabrication process. A semiconductor wafer or IC chips must be stored or transported between various process stations in order to perform various fabrication processes.

A wafer carrier is often picked up and placed by a carrier handling device for transporting, cleaning, or assembling the carrier. A conventional carrier handling device is not safe because it does not protect the carrier from falling down and has no collision avoidance mechanism. In addition, the conventional carrier handling device has a low efficiency by manually locating a picking and placing position for the carrier. Furthermore, the conventional carrier handling device is heavy and bulky and can only fit one size of carriers. As such, an apparatus and method for handling carriers to solve the above mentioned problems is desired.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION

Figure 1A:
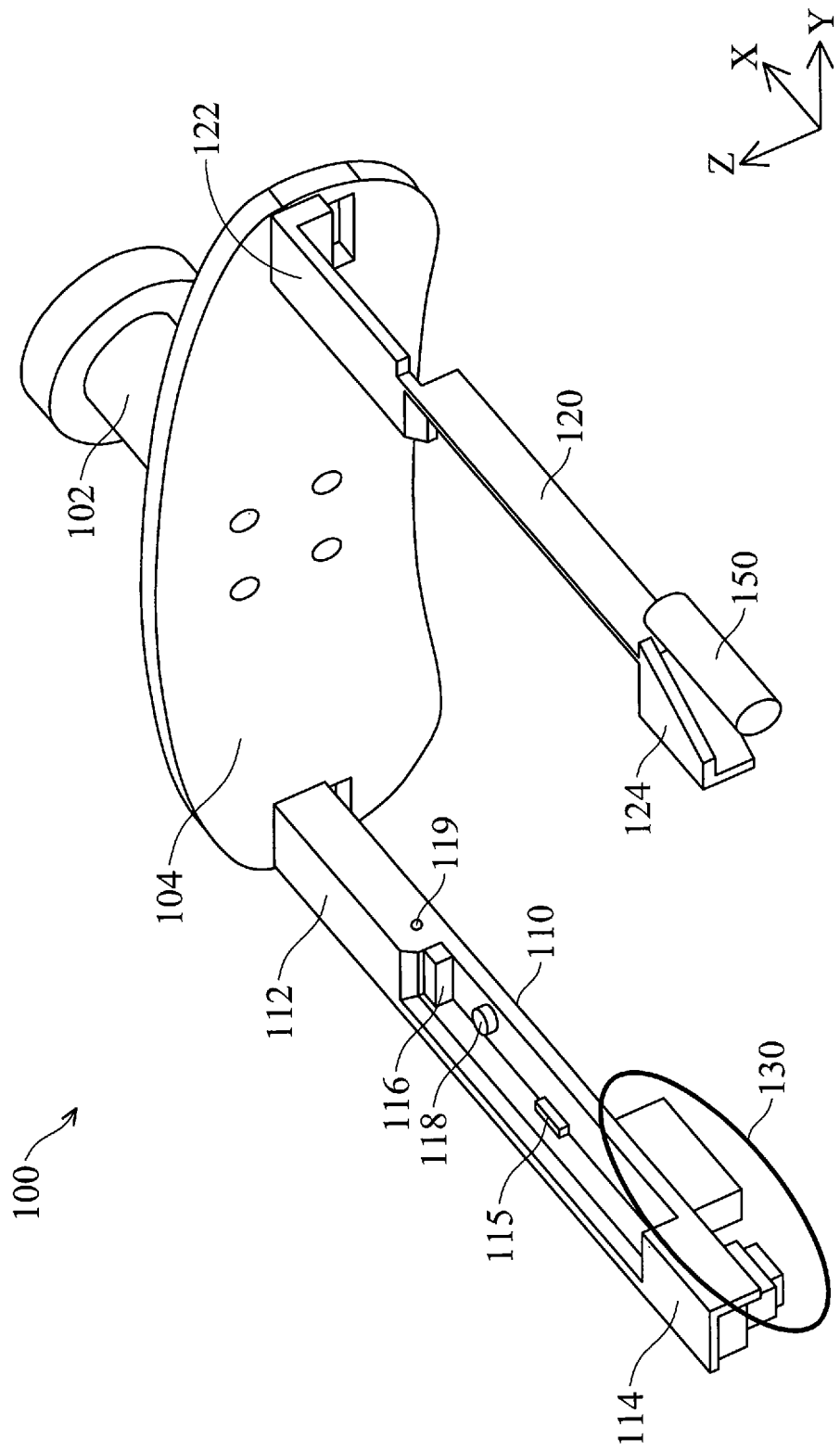
FIG. 1A illustrates an exemplary perspective view of a carrier handling device, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

A carrier holding a semiconductor part, e.g. a wafer or IC chips, is picked up and placed by a carrier handling device for cleaning, assembling, and transporting between various process stations in order to perform various fabrication processes. To improve safety and efficiency for handling semiconductor part carriers, the present disclosure introduces an apparatus having a multi-protection mechanism for carrier handling. In one embodiment, the apparatus has a fork-shaped mechanical arm having a handle and at least two prongs coupled to the handle. The mechanical arm may be applied on a mobile robot, a pod cleaning tool, a pod assembling tool, a pod transfer tool, etc.

In one embodiment, the apparatus may include an imaging system coupled to the mechanical arm for automatically locating or calibrating a goal position to which the semiconductor part is to be placed. The imaging system reduces robot teaching time cost and improves the accuracy of picking and placing motions. The apparatus may also include a collision avoidance sensor that can protect the carrier and the wafers in the carrier from damage and reduce wafer scrap. In one example, while the imaging system is coupled to one prong of the fork-shaped mechanical arm, the collision avoidance sensor is coupled to another prong of the fork-shaped mechanical arm.

In another embodiment, the apparatus includes at least one sensor for detecting a holding status of a carrier, when picking or placing the carrier. There may be different types of sensors coupled to the mechanical arm for detecting the holding status, e.g. based on pressure detection and light detection. In one example, a semiconductor part carrier is determined to be successfully held by the mechanical arm only when all sensors detect an existence of the carrier between the prongs of the fork-shaped mechanical arm.

The disclosed apparatus has a high adaptability and multi-safety functions to handle various sizes of carriers. It enhances wafer productivity because factories need vehicles or tools for realizing fully automation by transferring pods with robots. The proposed design minimizes the size of the mechanical arm to make it fit various tools or robots. The present disclosure is applicable to all kinds of devices that deal with a semiconductor part carrier, e.g. a wafer pod, a boat magazine, etc.

Automated Material Handling Systems (AMHS) are used in semiconductor fabrication facilities ("FABs") to automatically handle and transport groups or lots of wafers between various processing machines ("tools") used in chip manufacturing. Multiple wafers are typically stored and transported together in wafer carriers by the AMHS between load ports of different wafer processing or other tools during the semiconductor fabrication process. The wafer carriers include standard mechanical interface (SMIF) pods which can hold a plurality of wafers (e.g. 200 mm or 8 inch), or front opening unified pods (FOUPs) which can hold larger 300 mm (12 inch) or 450 mm (18 inch) wafers. Typically, each wafer carrier holds on the order of approximately 25 wafers. The load port is used to handle not only semiconductor wafers but also different types of substrates to be processed such as liquid crystal display glass substrates and photomask glass substrates. The AMHS in a semiconductor FAB includes numerous types of automated and manual vehicles for moving and transporting the wafer carriers throughout the FAB during the manufacturing process. This can include for example automatic guided vehicles (AGVs), personal guided vehicles (PGVs), rail guided vehicles (RGVs), overhead shuttles (OHSs), and overhead hoist transports (OHTs). Of the foregoing AMHS wafer transport mechanisms, OHTs are commonly used to transport wafer carriers, from the load port of one tool to the load port of the next tool in the processing sequence. An OHT system includes "vehicles" that travel on an overhead monorail of the AMHS. The OHT vehicle on-board hoist is operable to raise and lower wafer carriers allowing the OHT vehicle to deposit and retrieve wafer carriers from the load ports of tools positioned along and on the floor beneath the overhead rail. In one embodiment, the proposed carrier handling device may be part of an OHT vehicle for safely and efficiently picking up and placing carriers like FOUP and SMIF pods.

FIG. 1A illustrates an exemplary perspective view of a carrier handling device 100, in accordance with some embodiments of the present disclosure. The carrier handling device 100 includes a fork-shaped mechanical arm that comprises a handle 102 and two prongs 110, 120 coupled to the handle 102, via a connector 104. The mechanical arm may be configured for holding a semiconductor part carrier that is operable to hold a plurality of semiconductor parts. Each of the plurality of semiconductor parts may comprise at least one of: a semiconductor wafer and a semiconductor die.

As shown in FIG. 1A, each of the two prongs 110, 120 has a proximal end coupled to the handle 102 via the connector 104 and a distal end farther away (along the −X direction) from the handle 102 than the proximal end. For example, the prong 110 has a proximal end 112 and a distal end 114; and the prong 120 has a proximal end 122 and a distal end 124. In one embodiment, each of the two prongs has a groove that is between the proximal end and the distal end of the prong and is configured for holding a grip of the semiconductor part carrier. Each groove on a prong has a proximal end and a distal end respectively corresponding to the proximal end and the distal end of the prong.

In one embodiment, there is a pressure sensor coupled to each prong and located in the respective groove of the prong. The pressure sensors are configured for determining a holding status of the semiconductor part carrier held by the mechanical arm based on pressure detection. For example, the pressure sensor 118 is located in the groove of the prong 110. Each prong may also have a light sensor 119 coupled thereon and configured for determining a holding status of the semiconductor part carrier held by the mechanical arm based on light detection. In addition, there is a size adapter 115, 116 in each groove to adaptively fit the mechanical arm to semiconductor part carriers with various sizes.

The carrier handling device 100 in this example further includes an imaging system 130 coupled to the mechanical arm and configured for automatically locating a goal position on a surface onto which the semiconductor part carrier is to be placed. As shown in FIG. 1A, the imaging system 130 is located at the distal end 114 of a first one 110 of the two prongs. In addition, the carrier handling device 100 in this example further includes a sensor 150 located at the distal end 124 of a second one 120 of the two prongs and configured for detecting a barrier on a moving path of the mechanical arm to avoid a collision with the barrier. As shown in FIG. 1A, both the imaging system 130 and the sensor 150 are located under (i.e. along the −Z, direction) the prongs of the mechanical arm. In one embodiment, the positions of the imaging system 130 and the sensor 150 may be switched with each other.

Figure 1B:
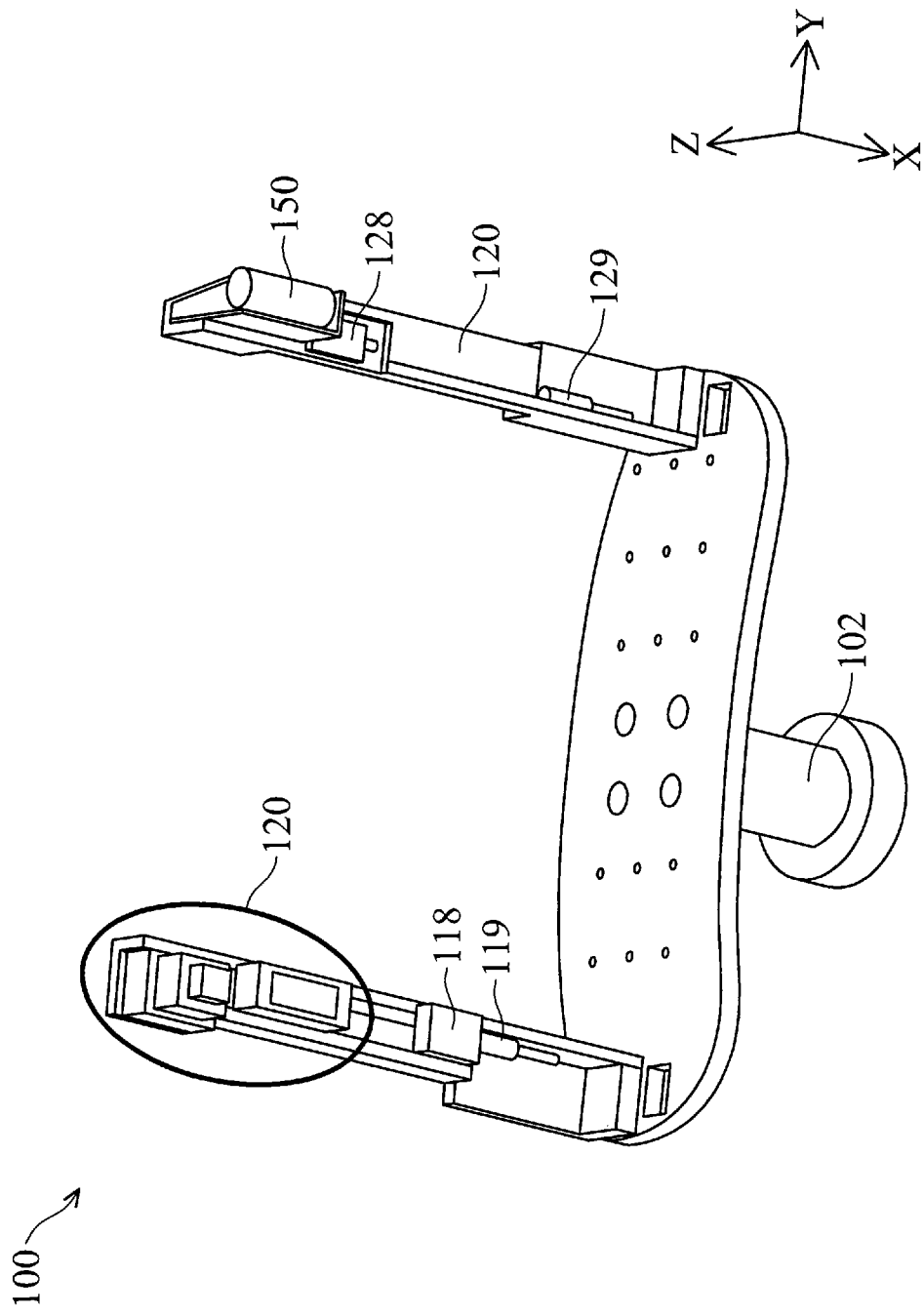
FIG. 1B illustrates another exemplary perspective view of the carrier handling device shown in FIG. 1A, in accordance with some embodiments of the present disclosure.

FIG. 1B illustrates another exemplary perspective view of the carrier handling device 100 shown in FIG. 1A, in accordance with some embodiments of the present disclosure. FIG. 1B shows a bottom side of the carrier handling device 100. As shown in FIG. 1B, both the imaging system 130 and the sensor 150 are located under (i.e. along the −Z direction) the prongs 110, 120 of the mechanical arm.

As shown in FIG. 1B, a pair of pressure sensors 118, 128 are coupled to the two prongs 110, 120 respectively for determining a holding status of the semiconductor part carrier held by the mechanical arm based on pressure detection. For example, once a grip of a carrier is held by a groove, a pressure is applied to and detected by the pressure sensor in the groove to generate a pressure signal when the detected pressure is higher than a predetermined threshold. The pressure sensor 118 is located in a first groove and has a closer distance to the proximal end of the first groove than that to the distal end of the first groove; while the pressure sensor 128 is located in a second groove and has a closer distance to the distal end of the second groove than that to the proximal end of the second groove. That is, the pressure sensors 118, 128 are located at different positions along the X direction. This may better ensure a safe detection of an existence of a carrier between the two prongs 110, 120, by detecting both grips of the carrier at different distances compared to the handle 102 with pressure detection.

In addition, a pair of light sensors 119, 129 are located on the two prongs 110, 120 respectively and configured for determining a holding status of the semiconductor part carrier held by the mechanical arm based on light detection. The light sensors 119, 129 are located with a same distance to the handle 102 along the X direction. For example, one of the light sensors 119, 129 may emit a light to the other one. When a substantial part of the light is received by the receiving light sensor, it is determined that no carrier is located between the two prongs 110, 120. When the received light at the receiving light sensor is weaker than a predetermined threshold, it is determined that a carrier is located between the two prongs 110, 120. As such, once a carrier is put between the two prongs 110, 120, while the two grips of the carrier is held in the two grooves respectively, a corresponding portion adjacent to each grip of the carrier has a non-transparent material that can block the light between the two light sensors 119, 129 to trigger a light signal generated by the two light sensors 119, 129 to indicate an existence of the carrier.

In one embodiment, the semiconductor part carrier is determined to be successfully held by the mechanical arm based on both the pressure detection by the pair of pressure sensors 118, 128 and the light detection by the pair of light sensors 119, 129. For example, the carrier handling device 100 determines that the semiconductor part carrier is successfully held by the mechanical arm only when each of the pressure sensors 118, 128 detects a pressure signal representing a pressure of the semiconductor part carrier applied on the mechanical arm and the pair of light sensors 119, 129 detects a light signal indicating an existence of the semiconductor part carrier between prongs 110, 120 of the mechanical arm.

Figure 2:
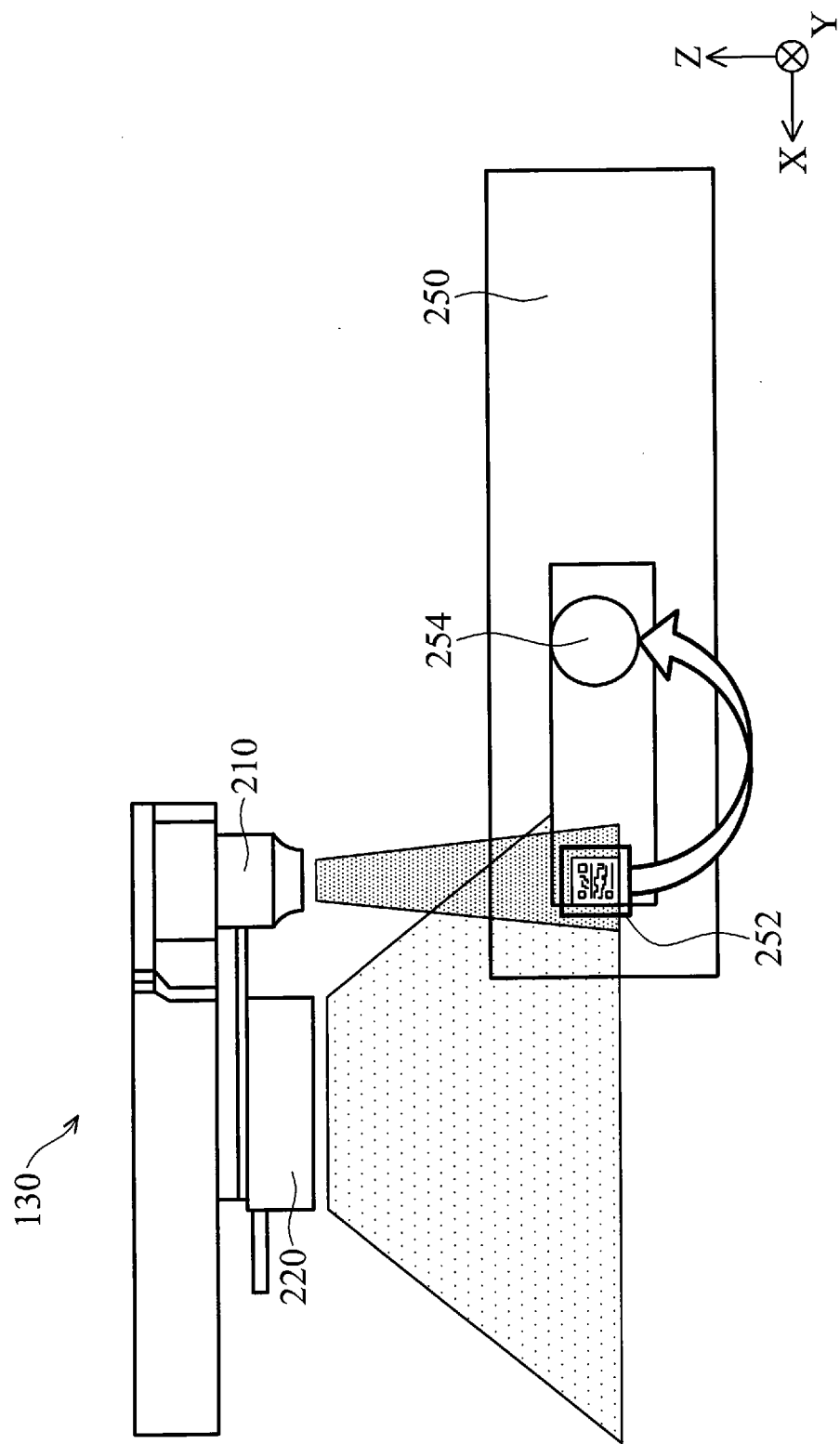
FIG. 2 illustrates an exemplary imaging system module of a carrier handling device, in accordance with some embodiments of the present disclosure.

FIG. 2 illustrates an exemplary imaging system module 130 of a carrier handling device, e.g. the carrier handling device 100 in FIG. 1A and FIG. 1B, in accordance with some embodiments of the present disclosure. The imaging system 130 is configured for automatically locating a goal position 254 on a surface 250 onto which a semiconductor part carrier is to be placed by the mechanical arm. As shown in FIG. 2, the imaging system 130 comprises a camera 210 that is configured for capturing a picture of an optical code 252 on the surface 250. The optical code 252 may indicate the goal position 254 on the surface 250. The imaging system 130 further comprises a light source 220 that is adjacent to the camera 210 and configured for emitting lights for the camera 210 to capture pictures. With the imaging system 130, the carrier handling device 100 holding a semiconductor part carrier can automatically and accurately locate the goal position 254 on the surface 250 onto which the semiconductor part carrier is to be placed; and place the semiconductor part carrier onto the surface 250 based on the goal position 254.

In one example, the surface 250 may be a level surface of a lord port. The optical code 252 may be a matrix barcode, e.g. a quick response (QR) code. In one embodiment, the light source 220 first emits a light to the optical code 252 on the surface 250. Then based on the light, the camera 210 can capture a picture of the optical code. By reading information of the optical code on the picture, the carrier handling device 100 can determine the goal position 254 on the surface 250. For example, after the optical code is read, by either a local computer coupled to the carrier handling device 100 or a remote server connected to the carrier handling device 100, the carrier handling device 100 can determine a position of the optical code 252 relative to the mechanical arm. In addition, since the relative positions between the optical code 252 and the goal position 254 are predetermined, the carrier handling device 100 can further determine the position of the goal position 254 relative to the mechanical arm accurately. As shown in FIG. 2, the optical code 252 is located at the outer side (along the X direction) of the goal position 254, which can help to avoid a collision between the mechanical arm and an existing carrier at the goal position 254 while the imaging system 130 scans the optical code 252.

Figure 3A:
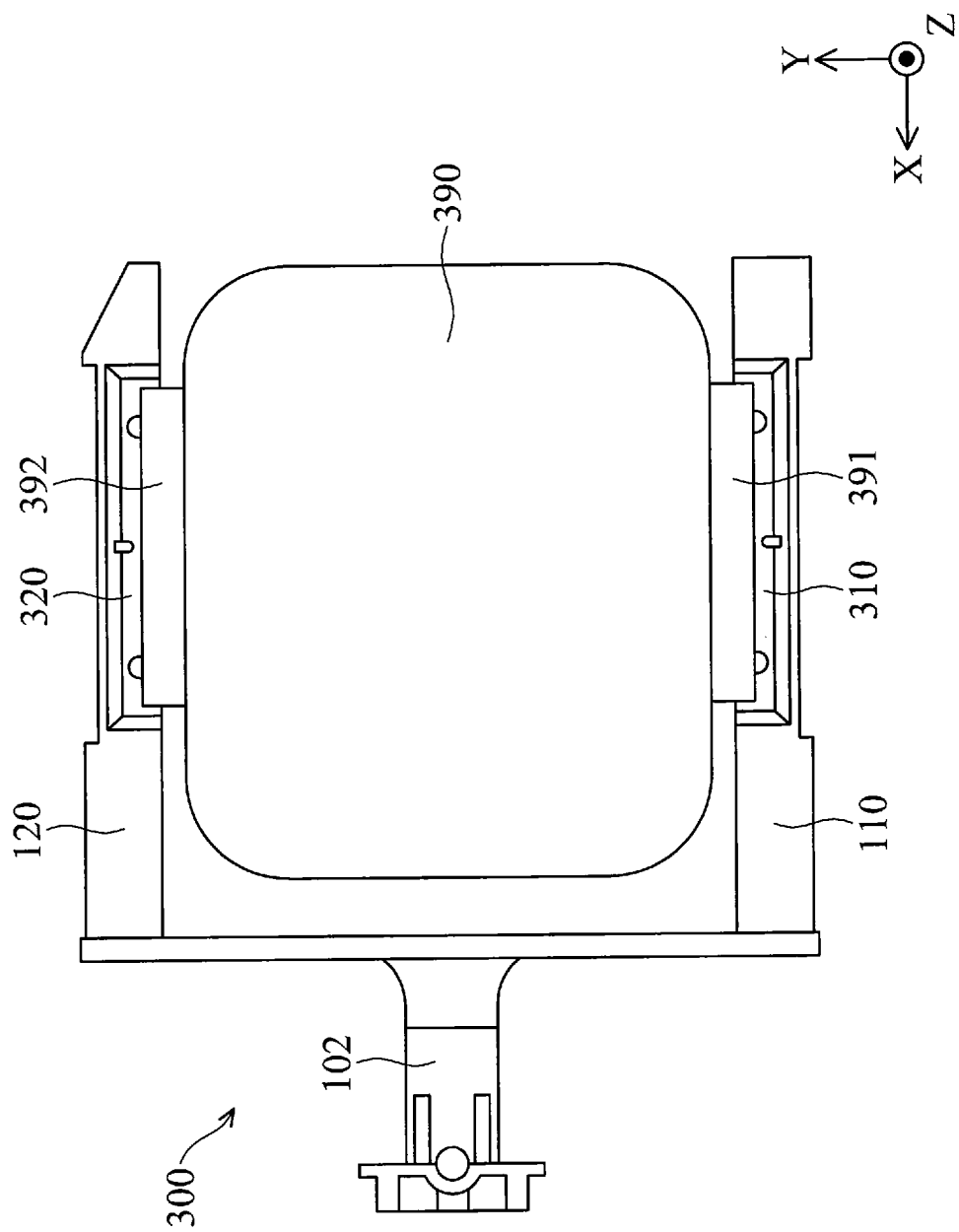
FIG. 3A illustrates a top view of an exemplary carrier handling device, in accordance with some embodiments of the present disclosure.

FIG. 3A illustrates a top view of an exemplary carrier handling device 300, in accordance with some embodiments of the present disclosure. As shown in FIG. 3A, the carrier handling device 300 has a mechanical arm with a shape of a fork that comprises a handle 102 and two prongs 110, 120 coupled to the handle 102. The two prongs 110, 120 are parallel to each other and extending along the X direction. Each of the two prongs 110, 120 has a proximal end closer to the handle 102 and a distal end farther away from the handle 102 than the proximal end. Each prong has a groove between the proximal end and the distal end of the prong. For example, the prong 110 has a groove 310; while the prong 120 has a groove 320. Each groove is configured for holding a grip of a semiconductor part carrier. As shown in FIG. 3A, the carrier handling device 300 is holding a wafer carrier pod 390 by holding its grips 391, 392 in the grooves 310, 320, respectively. The grooves 310, 320 can stably and safely hold the grips 391, 392 and protect the pod 390 from falling off when holding the pod 390.

Figure 3B:
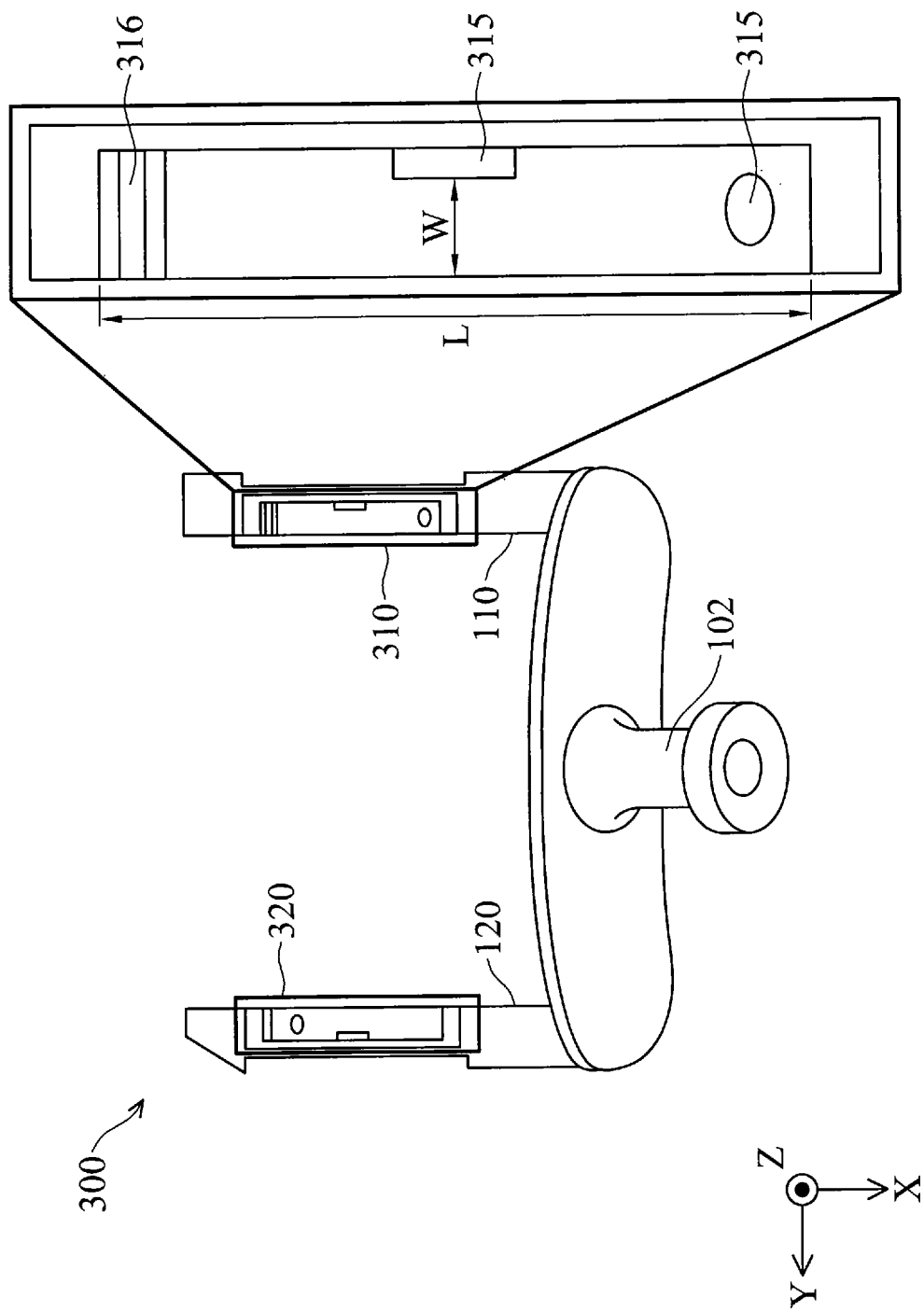
FIG. 3B illustrates a more detailed top view of the exemplary carrier handling device shown in FIG. 3A, in accordance with some embodiments of the present disclosure.

FIG. 3B illustrates a more detailed top view of the exemplary carrier handling device 300 shown in FIG. 3A, in accordance with some embodiments of the present disclosure. As shown in FIG. 3B, each of the two prongs 110, 120 has a respective groove 310, 320 thereon along the Z direction. Each groove has a pressure sensor and a size adapter located thereon. Taking the groove 310 for example, there is a pressure sensor 318 located on the groove 310 and configured for determining a holding status of the semiconductor part carrier held by the mechanical arm based on pressure detection.

In addition, there is a size adapter located in each groove and configured for adaptively fitting the mechanical arm to semiconductor part carriers with various sizes. Taking the groove 310 for example, the size adapter located in the groove 310 includes a width controller 315 and a length controller 316. While the groove 310 extends along the X direction, the length controller 316 in this example can be adjusted to fit a given length L (along the X direction) associated with a grip of a semiconductor part carrier. In addition, the width controller 315 in this example can be adjusted to fit a given width W (along the Y direction) associated with a grip of a semiconductor part carrier. As such, by adjusting the protruding amount of each of the size adapters 315, 316, the carrier handling device 300 can adaptively hold different carriers with different sizes safely and efficiently. Each of the size adapters 315, 316 may be a modifiable block including a non-slip material to fix the grips of the carrier being held. As such, the carrier handling device 300 has a high adaptability with respect to different carrier sizes.

Figure 3C:
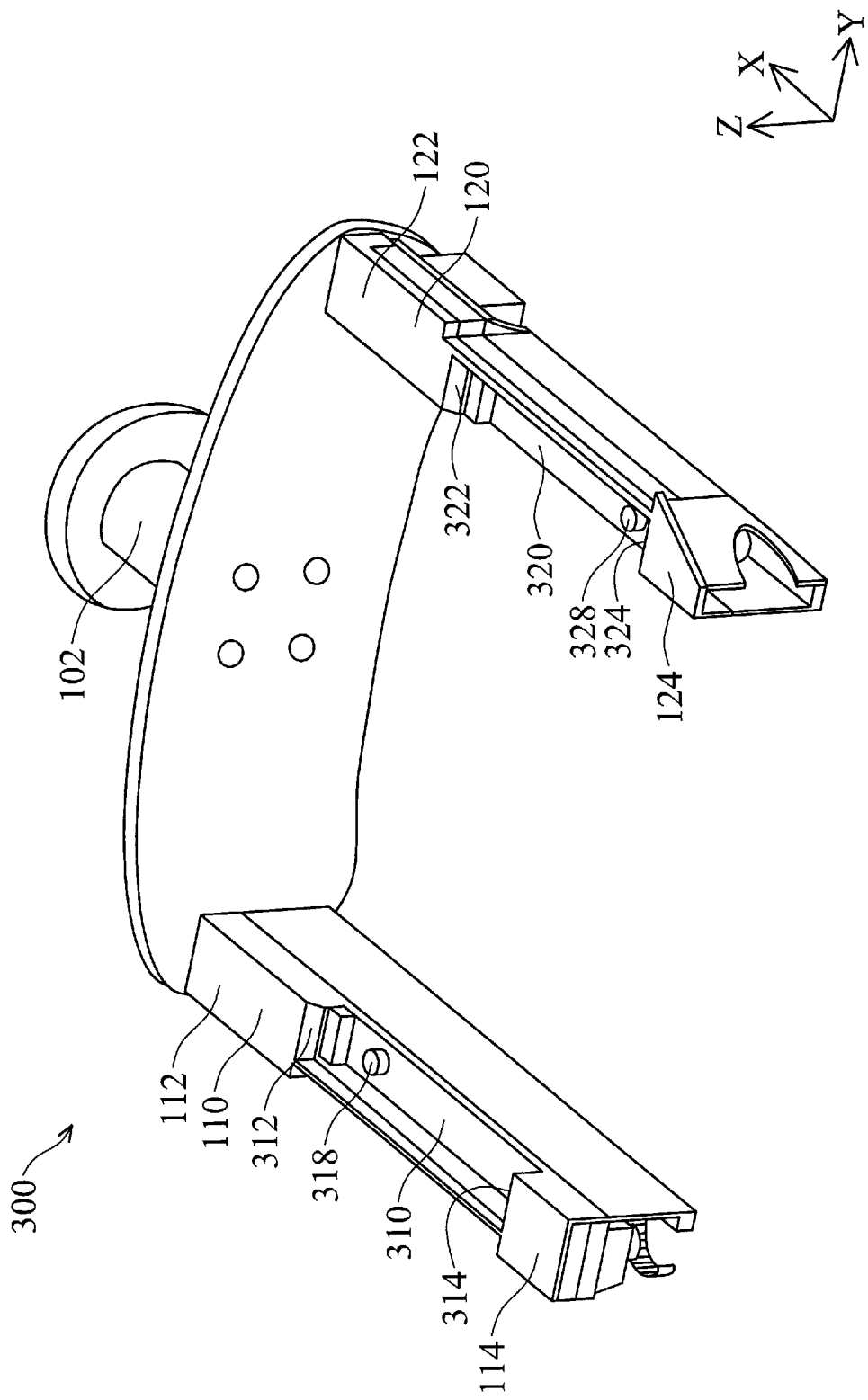
FIG. 3C illustrates a perspective view of the exemplary carrier handling device shown in FIG. 3A, in accordance with some embodiments of the present disclosure.

FIG. 3C illustrates a perspective view of the exemplary carrier handling device 300 shown in FIG. 3A, in accordance with some embodiments of the present disclosure. As shown in FIG. 3C, each of the two prongs 110, 120 coupled to the handle 102 has a proximal end 112, 122 closer to the handle 102 and a distal end 114, 124 farther away from the handle 102 than the proximal end 112, 122. The prong 110 has a groove 310 having a proximal end 312 and a distal end 314 respectively corresponding to the proximal end 112 and the distal end 114 of the prong 110. The prong 120 has a groove 320 having a proximal end 322 and a distal end 324 respectively corresponding to the proximal end 122 and the distal end 124 of the prong 120. Each groove is configured for holding a grip of a semiconductor part carrier.

As shown in FIG. 3C, a pair of pressure sensors 318, 328 are located on the two prongs 110, 120 respectively and in the respective grooves 310, 320 of the prongs 110, 120. As shown in FIG. 3C, a first one 318 of the pair of pressure sensors is located in a first groove 310 and has a closer distance to the proximal end 312 of the first groove 310 than that to the distal end 314 of the first groove 310; and a second one 328 of the pair of pressure sensors is located in a second groove 320 and has a closer distance to the distal end 324 of the second groove 320 than that to the proximal end 322 of the second groove 320. The pressure sensors are configured for determining a holding status of the semiconductor part carrier held by the mechanical arm based on pressure detection.

Figure 3D:
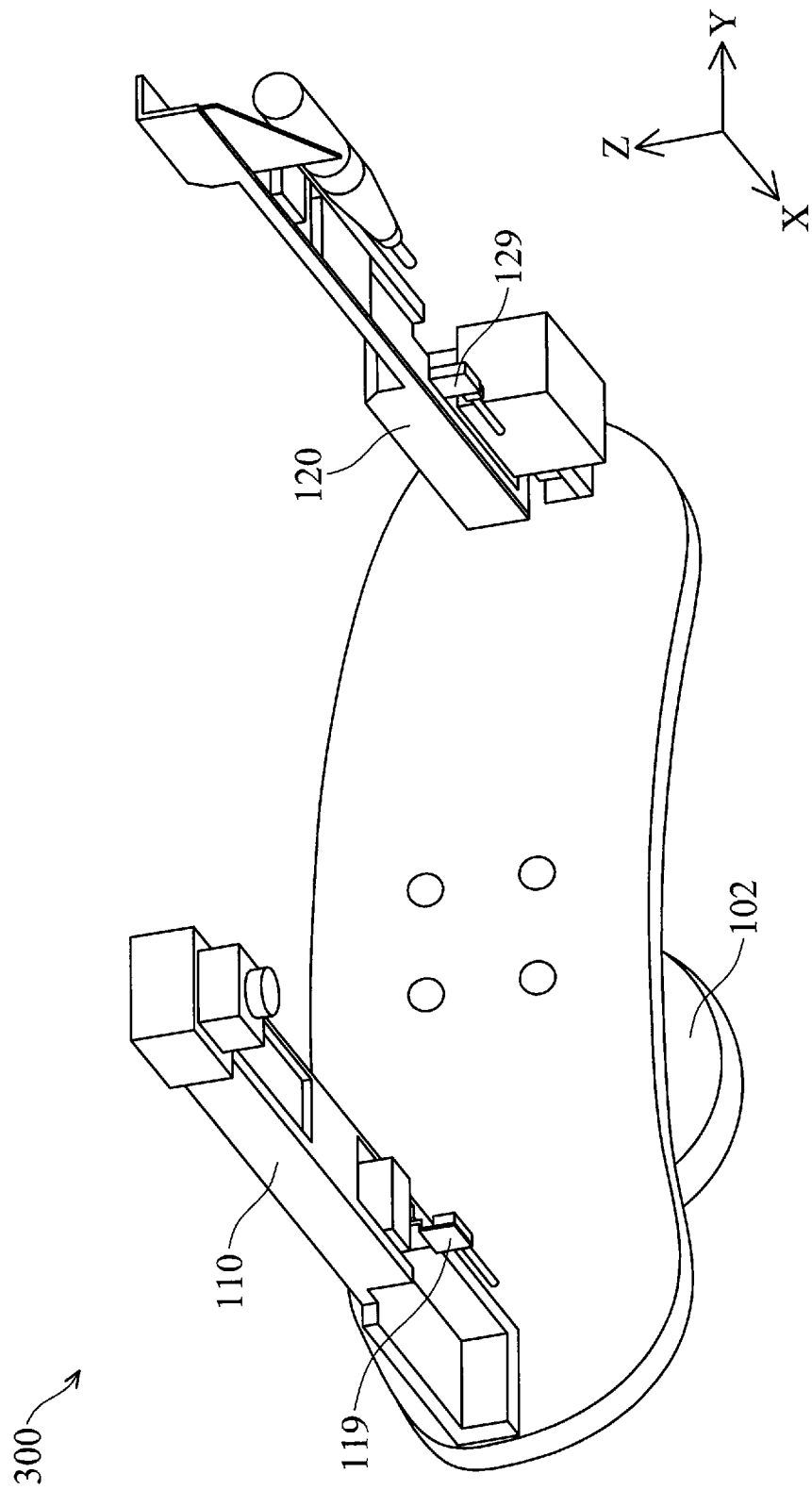
FIG. 3D illustrates another perspective view of the exemplary carrier handling device shown in FIG. 3A, in accordance with some embodiments of the present disclosure.

FIG. 3D illustrates another perspective view of the exemplary carrier handling device 300 shown in FIG. 3A, in accordance with some embodiments of the present disclosure. As shown in FIG. 3D, a pair of light sensors 119, 129 are located on the two prongs 110, 120, respectively. Each of the light sensors 119, 129 is located between the proximal end of the respective prong and the proximal end of the groove on the respective prong. That is, each of the light sensors 119, 129 is located at an inner side (along the X direction) of the groove on the respective prong. The pair of light sensors are configured for determining a holding status of the semiconductor part carrier held by the mechanical arm based on light detection.

Figure 4:
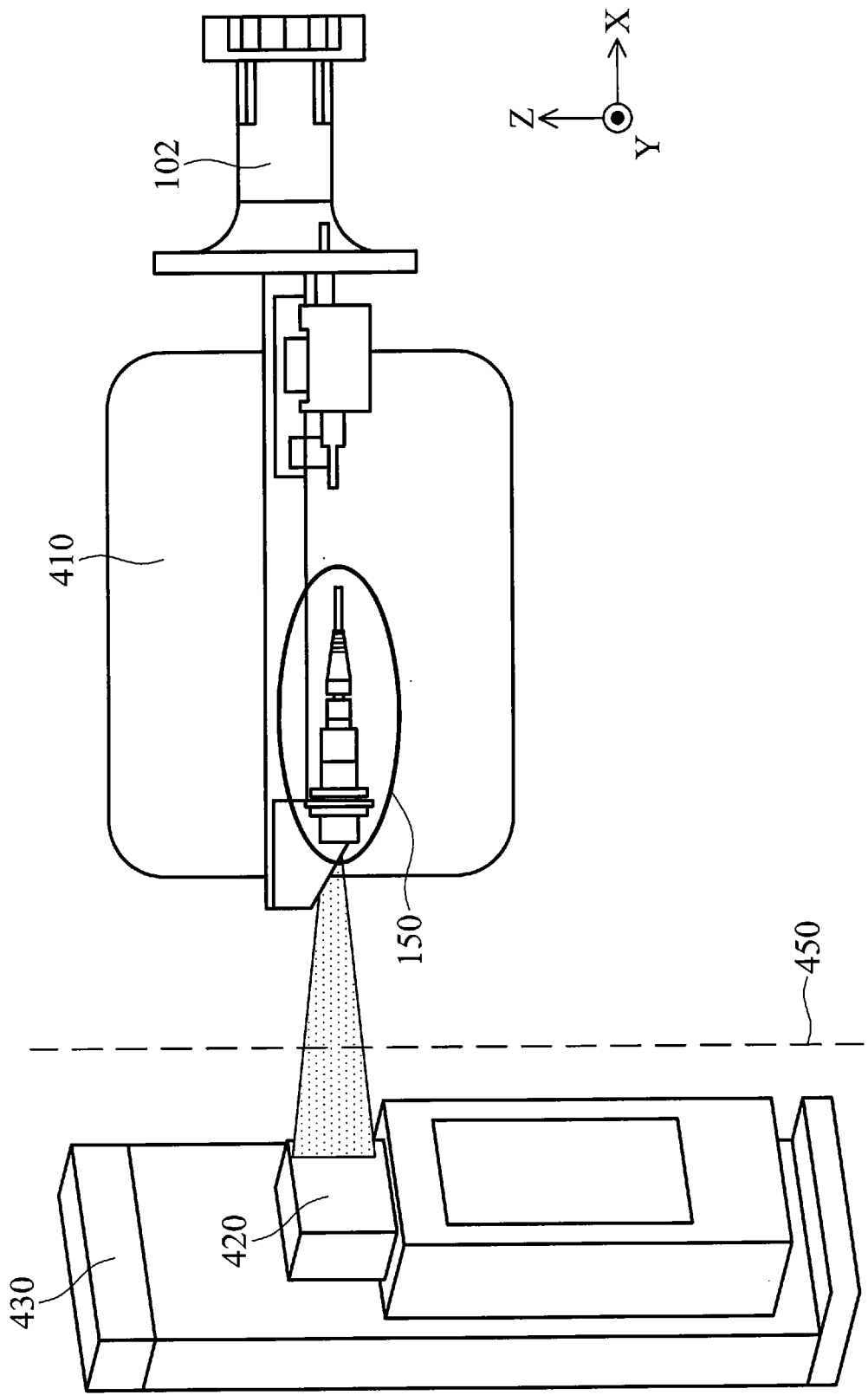
FIG. 4 illustrates a collision avoidance mechanism of an exemplary carrier handling device, in accordance with some embodiments of the present disclosure.

FIG. 4 illustrates a collision avoidance mechanism of an exemplary carrier handling device, e.g. the carrier handling device 100 in FIGS. 1A-1B or the carrier handling device 300 in FIGS. 3C-3D, in accordance with some embodiments of the present disclosure. As shown in FIG. 4, the carrier handling device has a sensor 150 located at the distal end of one prong of the fork-shaped mechanical arm.

In the example shown in FIG. 4, as the carrier handling device moves along the −X direction to put a wafer carrier pod 410 on a surface of a lord port 430, there is an existing pod 420 located on the surface. The sensor 150 in this example can detect the existing pod 420, which is a barrier on a moving path of the mechanical arm, to avoid a collision before the mechanical arm moves into contact with the existing pod 420 or the lord port 430. The detection may be based on ultrasound. If a barrier is detected by the sensor 150, the carrier handling device will stop the mechanical arm before the stop line 450 and send a report about the detected barrier. The carrier handling device may either wait for a removal of the barrier or continue placing the pod 410 elsewhere according to an instruction. As such, the sensor 150 can ensure a safe operation of moving a carrier by the mechanical arm by protecting the carrier and parts therein from damage and reducing the scrap rate.

Figure 5A:
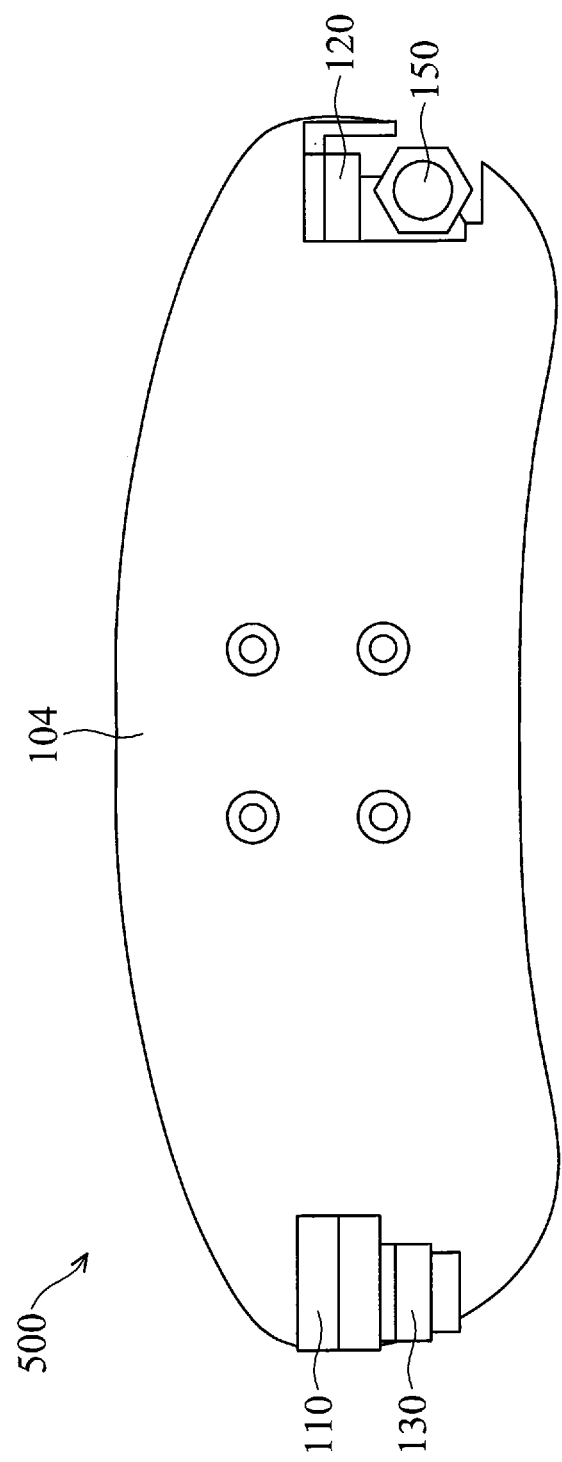
FIG. 5A illustrates a side view of an exemplary carrier handling device, in accordance with some embodiments of the present disclosure.

FIG. 5A illustrates a side view of an exemplary carrier handling device 500, in accordance with some embodiments of the present disclosure. As shown in FIG. 5A, the imaging system 130 and the sensor 150 are located below (along the −Z direction) the prong 110 and the prong 120, respectively. This saves space and size for the entire carrier handling device 500.

Figure 5B:
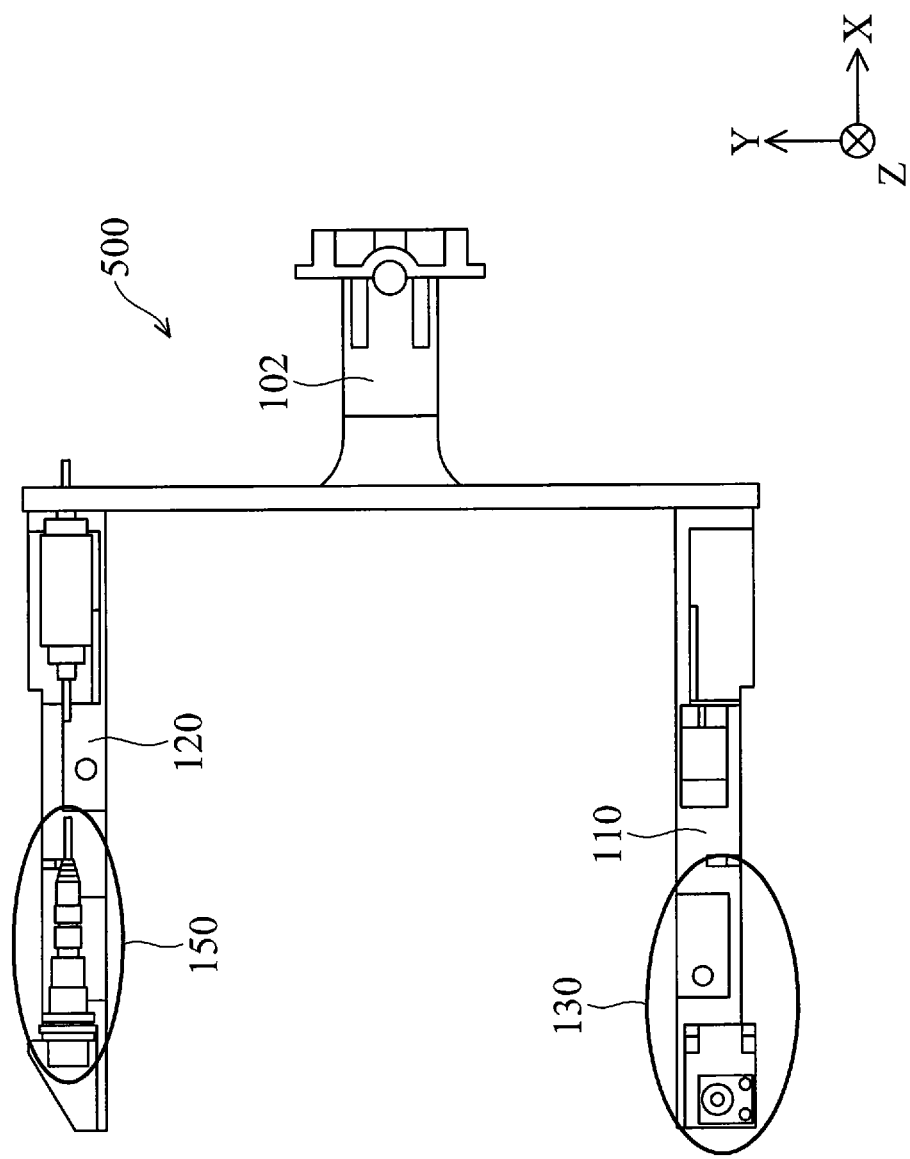
FIG. 5B illustrates a bottom view of the exemplary carrier handling device shown in FIG. 5A, in accordance with some embodiments of the present disclosure.

FIG. 5B illustrates a bottom view of the exemplary carrier handling device 500 shown in FIG. 5A, in accordance with some embodiments of the present disclosure. As shown in FIG. 5B, the imaging system 130 and the sensor 150 do not extend much the dimension of the prongs 110, 120.

Figure 5C:
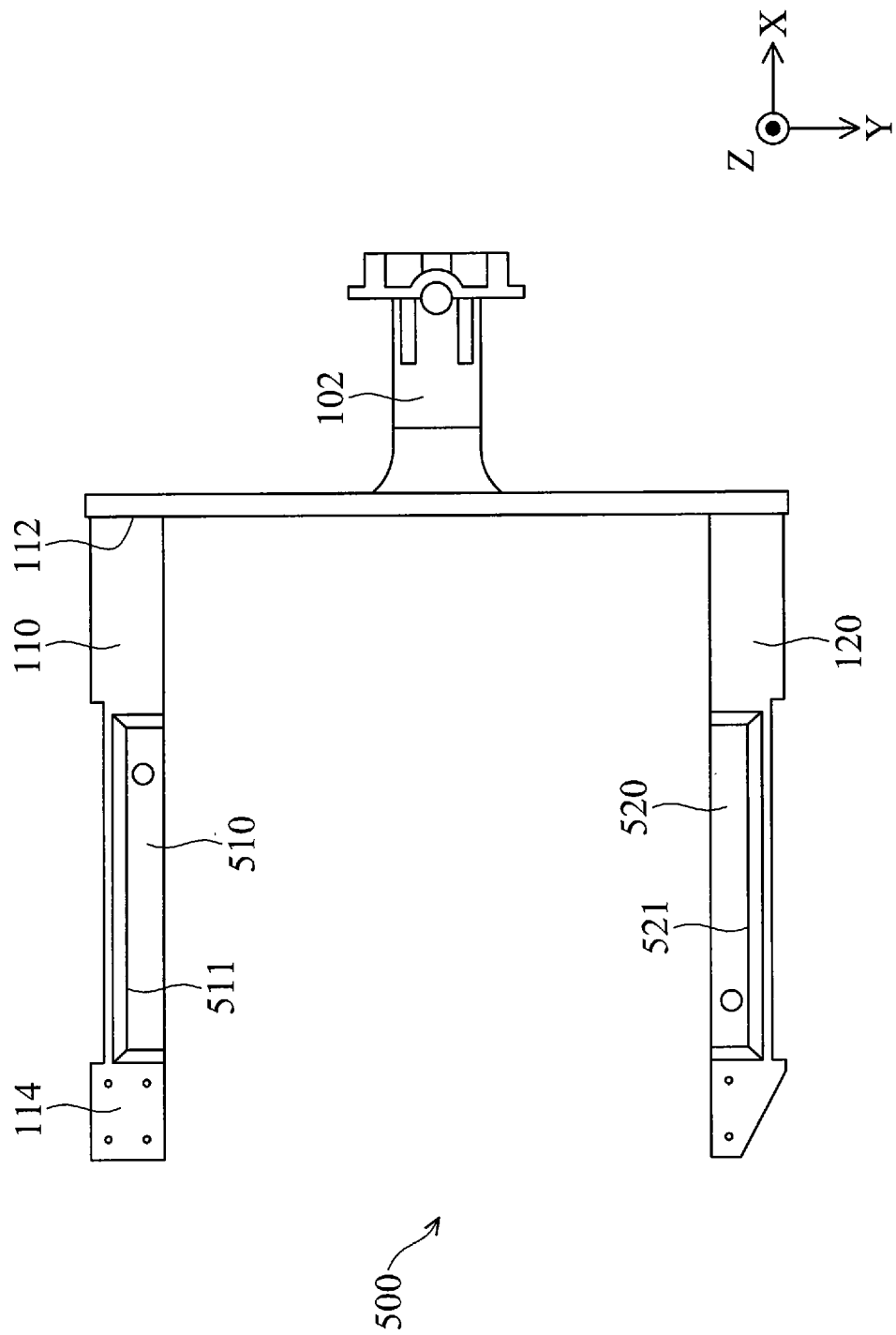
FIG. 5C illustrates a top view of the exemplary carrier handling device shown in FIG. 5A with exemplary dimension values, in accordance with some embodiments of the present disclosure.

FIG. 5C illustrates a top view of the exemplary carrier handling device shown in FIG. 5A with exemplary dimension values, in accordance with some embodiments of the present disclosure. In the example shown in FIG. 5C, the handle 102 has a length of 110 mm along the X direction; and the prongs 110, 120 are 305 mm long along the X direction. The outer width along the Y direction of the mechanical arm is 350 mm. The inner width along the Y direction of the mechanical arm, i.e. the distance between the two prongs 110, 120, is 276 mm.

As each prong has a groove, each of the grooves 510, 520 may have a length of 148 mm along the X direction. A distance along the X direction between the proximal end of the groove 510 and the proximal end 112 of the prong 110 is 97 mm. In addition, the grooves 510, 520 respectively have the side walls 511, 521 that are facing each other. A distance along the Y direction between the side walls 511, 521 in this example is 314 mm. Since there is a size adapter in each groove to adaptively fit the carrier handling device 500 to hold semiconductor part carriers with various sizes, the carrier handling device 500 in this example may safely hold any semiconductor part carrier that has a total width including the grips along the Y direction between about 280 mm and 314 mm and has a grip length less than 148 mm.

Figure 6:
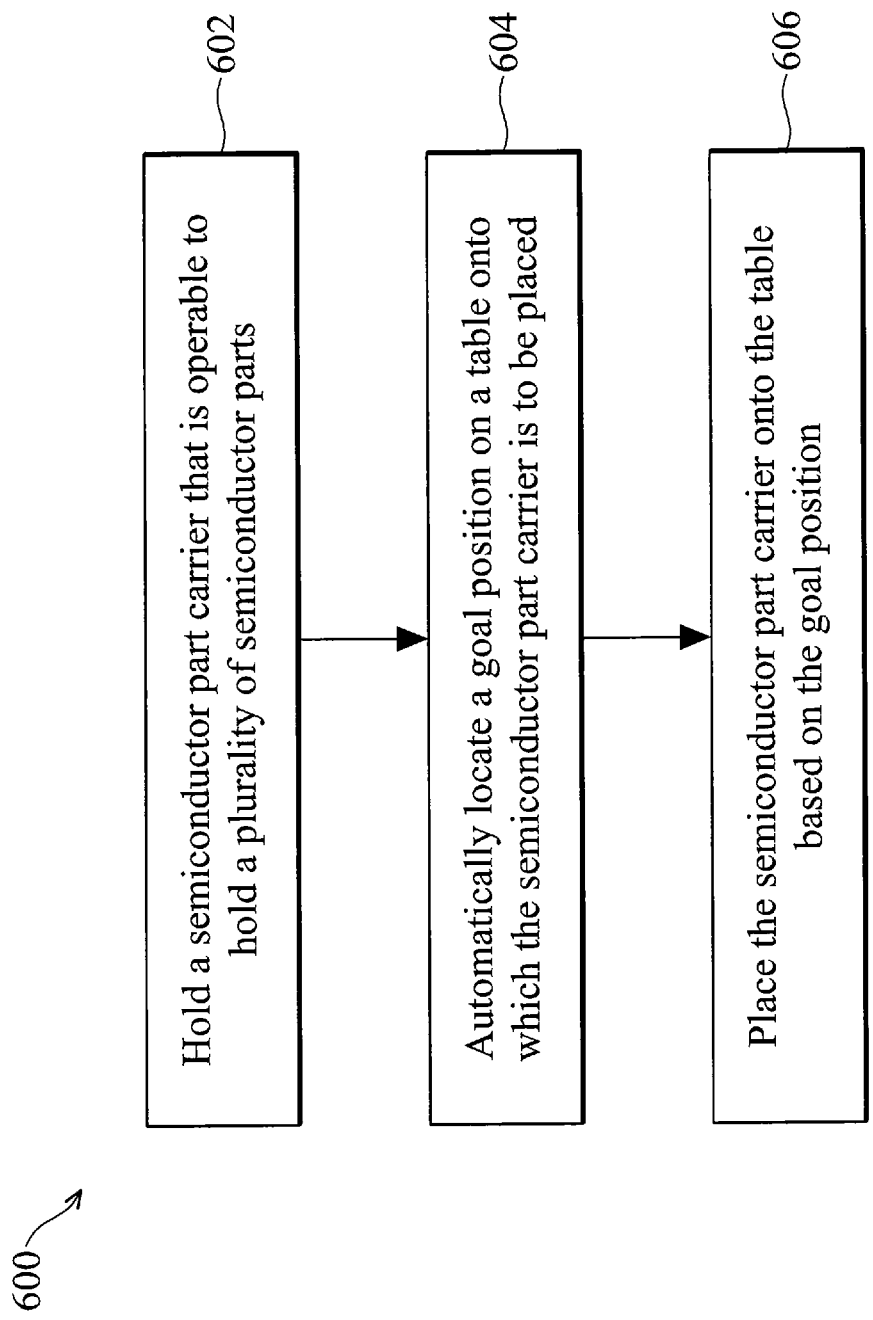
FIG. 6 is a flow chart illustrating an exemplary method for handling semiconductor part carriers, in accordance with some embodiments of the present disclosure.

FIG. 6 is a flow chart illustrating an exemplary method 600 for handling semiconductor part carriers, in accordance with some embodiments of the present disclosure. As shown in FIG. 6, a semiconductor part carrier that is operable to hold a plurality of semiconductor parts is held at operation 602. A goal position on a surface onto which the semiconductor part carrier is to be placed is automatically located at operation 604. The semiconductor part carrier is placed at operation 606 onto the surface based on the goal position.

The order of the operations shown in FIG. 6 may be changed according to different embodiments of the present disclosure.

Figure 7:
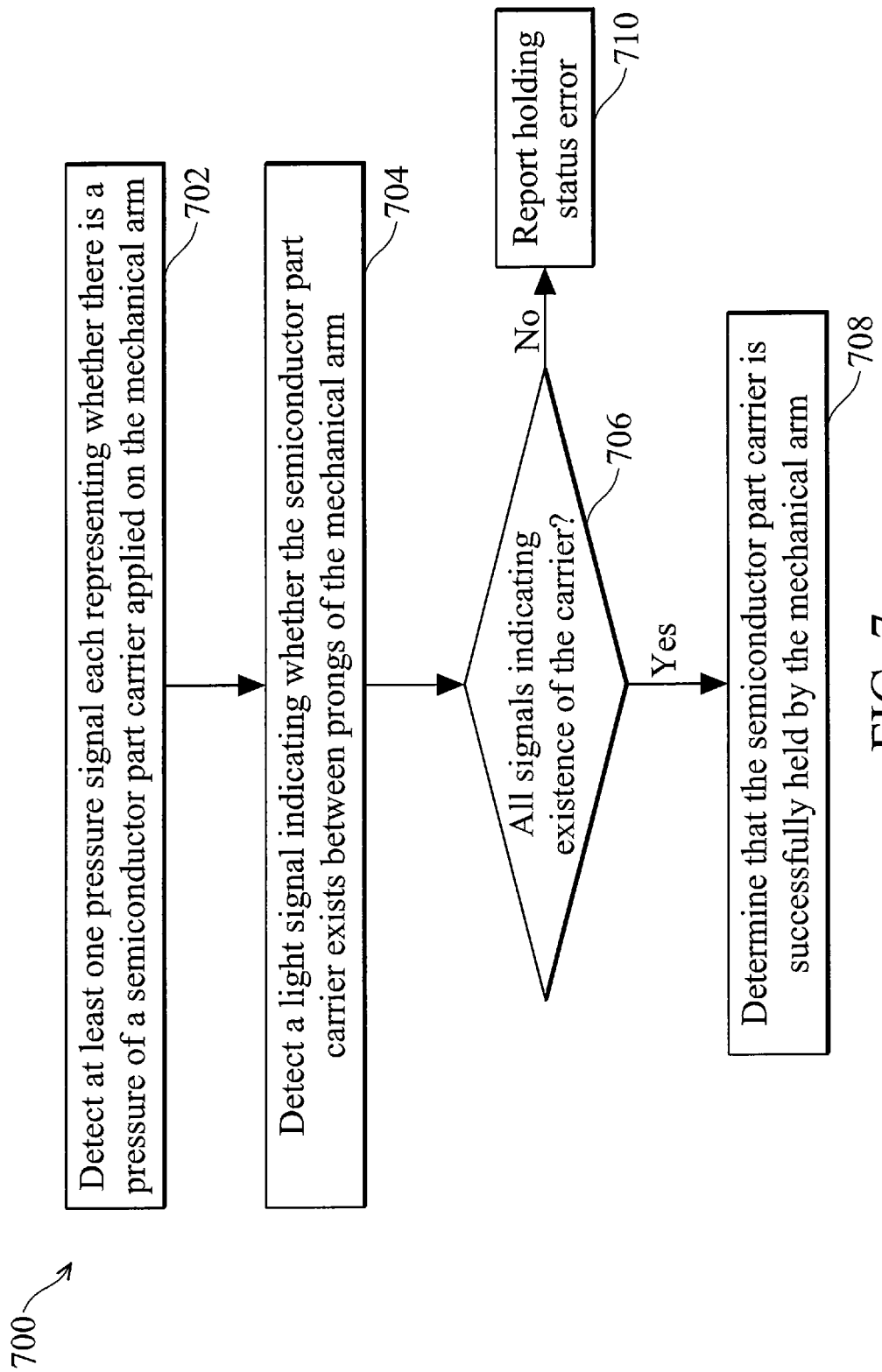
FIG. 7 is a flow chart illustrating an exemplary method for inspecting a holding status of a semiconductor part carrier, in accordance with some embodiments of the present disclosure.

FIG. 7 is a flow chart illustrating an exemplary method 700 for inspecting a holding status of a semiconductor part carrier, in accordance with some embodiments of the present disclosure. As shown in FIG. 7, at least one pressure signal each representing whether there is a pressure of a semiconductor part carrier applied on the mechanical arm is detected at operation 702. A light signal indicating whether the semiconductor part carrier exists between prongs of the mechanical arm is detected at operation 704. At operation 706, it is determined that whether all signals (the at least one pressure signal and the light signal) indicate an existence of a semiconductor part carrier. If so, the process goes to operation 708, where it is determined that the semiconductor part carrier is successfully held by the mechanical arm. If not, the process goes to operation 710, where a holding status error is reported. The order of the operations shown in FIG. 7 may be changed according to different embodiments of the present disclosure.

In an embodiment, an apparatus for handling semiconductor part carriers is disclosed. The apparatus includes a mechanical arm and an imaging system coupled to the mechanical arm. The mechanical arm is configured for holding a semiconductor part carrier. The imaging system is configured for automatically locating a goal position on a surface onto which the semiconductor part carrier is to be placed.

In another embodiment, an apparatus for handling semiconductor part carriers is disclosed. The apparatus includes a mechanical arm and a pair of pressure sensors located on the mechanical arm. The mechanical arm is configured for holding a semiconductor part carrier. The pair of pressure sensors are configured for determining a holding status of the semiconductor part carrier held by the mechanical arm based on pressure detection.

In yet another embodiment, a method for handling semiconductor part carriers is disclosed. The method includes: holding a semiconductor part carrier; automatically locating a goal position on a surface onto which the semiconductor part carrier is to be placed; and placing the semiconductor part carrier onto the surface based on the goal position.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for handling semiconductor part carriers, comprising:
    a mechanical arm configured for holding a semiconductor part carrier, wherein the mechanical arm has a shape of a fork that comprises a handle and two prongs coupled to the handle;
    a pair of pressure sensors configured to sense a respective pair of pressures applied by the semiconductor part carrier on the mechanical arm to produce a respective pair of continuous pressure values, wherein each of the respective pair of continuous pressure values is compared to a predetermined pressure threshold for determining a holding status of the semiconductor part carrier, wherein a first one of the pair of pressure sensors is located at a first distance from the handle along the first prong in an X direction, a second one of the pair of pressure sensors is located at a second distance from the handle along the second prong in the X direction, wherein the first distance is different from the second distance;
    a pair of light sensors each of which is located on a respective one of the two prongs, wherein each of the pair of light sensors is located with a same third distance to the handle along the X direction, wherein the first distance is larger than the third distance, and the second distance is larger than the third distance, wherein the pair of light sensors are configured for determining the holding status of the semiconductor part carrier, and wherein the semiconductor part carrier is determined to be successfully held by the mechanical arm when the holding status of the semiconductor part carrier is simultaneously determined by the pair of pressure sensors and the pair of light sensors; and
    an imaging system coupled to the mechanical arm and configured for automatically locating a goal position on a surface onto which the semiconductor part carrier is to be placed, wherein the mechanical arm is configured to place the semiconductor part carrier onto the goal position on the surface, wherein the goal position is indicated by an optical code, wherein the optical code is located at an outer side of the goal position.

2. The apparatus of claim 1, wherein:
    the semiconductor part carrier is operable to hold a plurality of semiconductor parts; and
    each of the plurality of semiconductor parts comprises at least one of: a semiconductor wafer and a semiconductor die.

3. The apparatus of claim 1, wherein:
    the imaging system comprises a camera that is configured for capturing a picture of the optical code on the surface; and
    the optical code indicates the goal position on the surface.

4. The apparatus of claim 3, wherein:
    the imaging system further comprises a light source that is adjacent to the camera and configured for emitting lights for the camera to capture pictures.

5. The apparatus of claim 1, wherein:
    the two prongs are parallel to each other; and
    each of the two prongs has a proximal end coupled to the handle and a distal end farther away from the handle than the proximal end.

6. The apparatus of claim 5, wherein:
    the imaging system is located at the distal end of a first one of the two prongs.

7. The apparatus of claim 5, further comprising:
    a sensor located at the distal end of a second one of the two prongs and configured for detecting a barrier on a moving path of the mechanical arm to avoid a collision with the barrier.

8. The apparatus of claim 5, wherein:
    each of the two prongs has a groove between the proximal end and the distal end of the prong;
    each groove on a prong has a proximal end and a distal end respectively corresponding to the proximal end and the distal end of the prong; and
    each groove is configured for holding a grip of the semiconductor part carrier.

9. The apparatus of claim 8, wherein each of the pair of pressure sensors is located on a respective one of the two prongs and in the respective groove of the prong, wherein the pair of pressure sensors is configured for determining the holding status of the semiconductor part carrier held by the mechanical arm based on pressure detection.

10. The apparatus of claim 9, wherein:
the first one of the pair of pressure sensors is located in a first groove and has a closer distance to the proximal end of the first groove than that to the distal end of the first groove; and
the second one of the pair of pressure sensors is located in a second groove and has a closer distance to the distal end of the second groove than that to the proximal end of the second groove.

11. The apparatus of claim 8, further comprising:
a size adapter located in each groove and configured for adaptively fitting the mechanical arm to semiconductor part carriers with various sizes.

12. The apparatus of claim 8, wherein the pair of light sensors each of which is located between the proximal end of the respective prong and the proximal end of the groove on the respective prong, wherein the pair of light sensors are configured for determining the holding status of the semiconductor part carrier held by the mechanical arm based on light detection.

13. An apparatus for handling semiconductor part carriers, comprising:
a mechanical arm configured for holding a semiconductor part carrier, wherein the mechanical arm has a shape of a fork that comprises a handle and a first prong and a second prong each coupled to the handle;
an imaging system coupled to the mechanical arm and configured for automatically locating a goal position on a surface onto which the semiconductor part carrier is to be placed, wherein the mechanical arm is configured to place the semiconductor part carrier onto the goal position on the surface, wherein the goal position is indicated by an optical code, wherein the optical code is located at an outer side of the goal position;
a pair of pressure sensors located on the mechanical arm and configured for determining a holding status of the semiconductor part carrier held by the mechanical arm based on pressure detection, wherein the pair of pressure sensors is configured to sense a respective pair of pressures applied by the semiconductor part carrier onto the mechanical arm to produce a respective pair of continuous pressure values, wherein each of the respective pair of continuous pressure values is compared to a predetermined pressure threshold for determining the holding status, wherein a first one of the pair of pressure sensors is located at a first distance from the handle along the first prong in an X direction, a second one of the pair of pressure sensors is located at a second distance from the handle along the second prong in the X direction, wherein the first distance is different from the second distance;
a pair of light sensors each of which is located on a respective one of the two prongs, wherein each of the pair of light sensors is located with a same third distance from the handle along the X direction, wherein the first distance is larger than the third distance, and the second distance is larger than the third distance, wherein the pair of light sensors are configured for determining the holding status of the semiconductor part carrier, and wherein the semiconductor part carrier is determined to be successfully held by the mechanical arm when the holding status of the semiconductor part carrier is simultaneously determined by the pair of pressure sensors and the pair of light sensors; and
a pair of size adapters each comprising a width controller and a length controller separate from the width controller, wherein:
the width controller is adjustable to fit the mechanical arm to various width sizes of different grips of semiconductor part carriers,
the length controller is adjustable to fit the mechanical arm to various length sizes of different grips of semiconductor part carriers.

14. The apparatus of claim 13, wherein:
each of the two prongs has a proximal end coupled to the handle and a distal end farther away from the handle than the proximal end;
each of the two prongs has a groove that is between the proximal end and the distal end of the prong and is configured for holding a grip of the semiconductor part carrier; and
each groove on a prong has a proximal end and a distal end respectively corresponding to the proximal end and the distal end of the prong.

15. The apparatus of claim 14, wherein:
each of the pair of pressure sensors is located on a respective one of the two prongs and in the respective groove of the prong; and
the pressure sensors are configured for determining a holding status of the semiconductor part carrier held by the mechanical arm based on pressure detection.

16. The apparatus of claim 15, wherein:
the first one of the pair of pressure sensors is located in a first groove and has a closer distance to the proximal end of the first groove than that to the distal end of the first groove; and
the second one of the pair of pressure sensors is located in a second groove and has a closer distance to the distal end of the second groove than that to the proximal end of the second groove.

17. The apparatus of claim 15, wherein the pair of light sensors each of which is located between the proximal end of the respective prong and the proximal end of the groove on the respective prong, wherein:
the pair of light sensors are configured for determining the holding status of the semiconductor part carrier held by the mechanical arm based on light detection; and
the semiconductor part carrier is determined to be successfully held by the mechanical arm based on both the pressure detection by the pair of pressure sensors and the light detection by the pair of light sensors.

18. A method for handling semiconductor part carriers, comprising:
holding a semiconductor part carrier by a mechanical arm, wherein the mechanical arm has a shape of a fork that comprises a handle and a first prong and a second prong each coupled to the handle;
automatically locating a goal position on a surface onto which the semiconductor part carrier is to be placed, wherein automatically locating the goal position comprises:
actively emitting a light to an optical code on the surface,
capturing a picture of the optical code based on the light, and
determining the goal position on the surface based on the picture of the optical code, wherein the optical code is located at an outer side of the goal position placing the semiconductor part carrier onto the goal position on the surface;

determining a holding status of the semiconductor part carrier held by the mechanical arm using a pair of light sensors based on light detection, wherein each of the pair of light sensors is located on a respective one of the two prongs, and wherein each of the pair of light sensors is located with a same first distance from the handle along an X direction;

determining whether each of a pair of pressures applied by the semiconductor part carrier onto the mechanical arm is less than a predetermined pressure threshold by comparing a respective one of a pair of continuous pressure values sensed by a respective one of a pair of pressure sensors to the predetermined pressure threshold, wherein a first one of the pair of pressure sensors is located at a second distance from the handle along the first prong in and X direction, a second one of the pair of pressure sensors is located at a third distance from the handle along the second prong in the X direction, wherein the second distance is different from the third distance, wherein the second distance is larger than the first distance, and the third distance is larger than the first distance, and wherein the semiconductor part carrier is determined to be successfully held by the mechanical arm when the holding status of the semiconductor part carrier is simultaneously determined by the pair of pressure sensors and the pair of light sensors; and determining that the semiconductor part carrier is not correctly held by the mechanical arm when the applied pressure is less than the predetermined pressure threshold.

19. The method of claim 18, wherein:

the semiconductor part carrier is held and placed onto the goal position by the mechanical arm;

the picture is captured by a camera coupled to the mechanical arm; and the light is emitted by a light source coupled to the mechanical arm and adjacent to the camera.

20. The method of claim 18, further comprising:

determining that the semiconductor part carrier is successfully held by the mechanical arm based on both the pair of continuous pressure values and a light signal generated by at least one of the pair of light sensors.

* * * * *